(12) United States Patent
Fukui

(10) Patent No.: US 6,975,399 B2
(45) Date of Patent: Dec. 13, 2005

(54) MARK POSITION DETECTING APPARATUS

(75) Inventor: Tatsuo Fukui, Kawasaki (JP)

(73) Assignee: Nikon Corporation, Tokyo (JP)

( * ) Notice: Subject to any disclaimer, the term of this patent is extended or adjusted under 35 U.S.C. 154(b) by 253 days.

(21) Appl. No.: 10/291,680

(22) Filed: Nov. 12, 2002

(65) Prior Publication Data

US 2004/0036879 A1 Feb. 26, 2004

(30) Foreign Application Priority Data

Nov. 12, 2001 (JP) ............................... 2001-346622

(51) Int. Cl.[7] .......................... G01B 11/14; G01B 11/00
(52) U.S. Cl. ....................... 356/401; 356/400; 356/620
(58) Field of Search ........................ 356/620, 400–401

(56) References Cited

U.S. PATENT DOCUMENTS

| 5,617,211 A | * | 4/1997 | Nara et al. .................. 356/401 |
| 5,754,299 A | | 5/1998 | Sugaya et al. |
| 6,140,654 A | * | 10/2000 | Nakasugi et al. ......... 250/491.1 |
| 6,456,377 B1 | * | 9/2002 | Suzuki et al. ............... 356/399 |
| 6,563,573 B1 | | 5/2003 | Morohoshi et al. |
| 2002/0060793 A1 | | 5/2002 | Fukui |

FOREIGN PATENT DOCUMENTS

| JP | A 2000-077295 | 3/2000 |
| JP | A 2000-349014 | 12/2000 |

* cited by examiner

*Primary Examiner*—Zandra V. Smith
(74) *Attorney, Agent, or Firm*—Oliff & Berridge PLC

(57) ABSTRACT

A mark position detecting apparatus includes: an illuminating unit that illuminates a mark on a substrate; an image forming optical system that forms an image of the mark with light from the mark; an adjustment unit that adjusts distortion manifesting at the image forming optical system; an image capturing unit that captures the image of the mark formed by the image forming optical system in which the distortion has been adjusted and outputs image signals; and a calculation unit that calculates a substantial central position of the mark based upon the image signals output by the image capturing unit.

19 Claims, 7 Drawing Sheets

100 (REGISTRATION MEASURING APPARATUS)

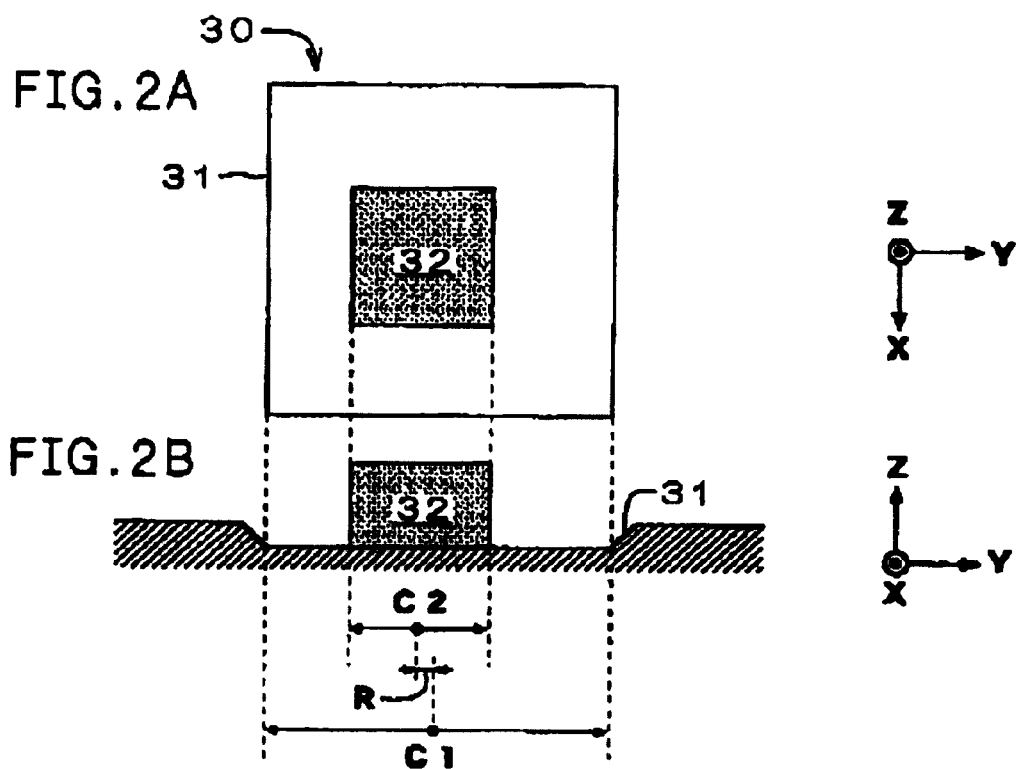
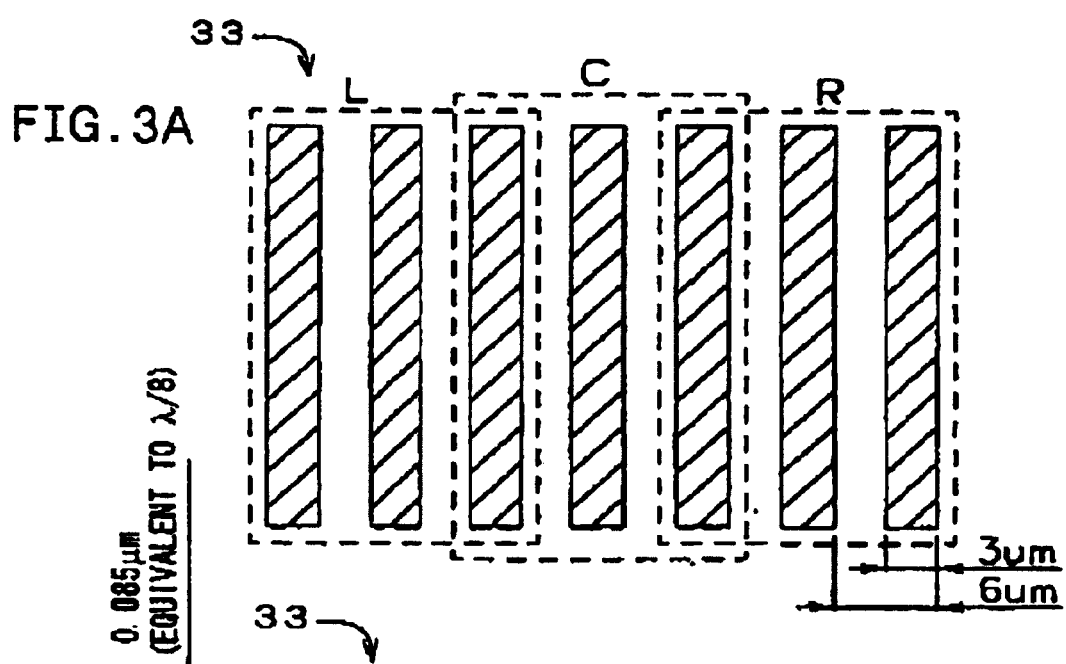
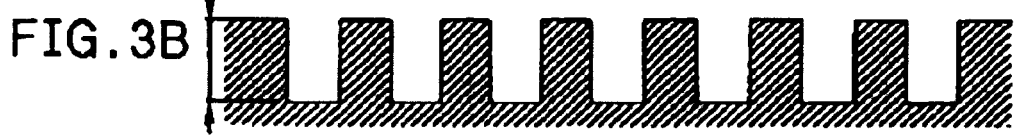

MARK POSITION DETECTING APPARATUS

INCORPORATION BY REFERENCE

The disclosures of the following applications are herein incorporated by reference:

Japanese Patent Application No. 2001-346622 filed Nov. 12, 2001

Japanese Patent Application No. H 10-242961 filed Aug. 8, 1998

BACKGROUND OF THE INVENTION

1. Field of the Invention

The present invention relates to a mark position detecting apparatus that detects, for instance, the position of a test mark on a substrate and, more specifically, it relates to a mark position detecting apparatus ideal for highly accurate position detection which may be performed during the process of manufacturing semiconductor elements or the like.

2. Description of the Related Art

As is known in the related art, when manufacturing a semiconductor element or a liquid crystal display element, a circuit pattern is transferred onto a film constituted of a specific material set directly under and adjacent to a resist film (a pattern formation process) by transferring the circuit pattern onto the resist film (resist pattern) through an exposure step during which the circuit pattern formed at a mask (a reticle) is imprinted on the resist film and a development step during which exposed portions or unexposed portions of the resist film are dissolved and then by performing etching, vapor deposition or the like with the resist pattern acting as a mask (a processing step).

Next, a similar pattern formation process is repeated in order to form another circuit pattern over the circuit pattern formed at the film constituted of the specific material. By repeatedly executing the pattern formation process numerous times, circuit patterns transferred onto films constituted of various materials are laminated on the substrate (a semiconductor wafer or a liquid crystal substrate), and thus, a semiconductor element circuit or a liquid crystal display element circuit is formed.

During the manufacturing process described above, the mask and the substrate are aligned with each other prior to the exposure step and the state of the registration of the resist pattern on the substrate is inspected after the development step and prior to the processing step in each pattern formation process so as to ensure that the circuit patterns at the films constituted of various materials are registered with precise alignment and ultimately to improve the product yield.

It is to be noted that the alignment of the mask and the substrate (executed prior to the exposure step), during which the circuit pattern on the mask and the circuit pattern formed on the substrate through the immediately preceding pattern formation process are aligned with each other, is executed by using marks indicating reference positions of the individual circuit patterns.

In addition, the inspection of the state of the registration of the resist pattern on the substrate (executed prior to the processing step), during which the state of registration of the resist pattern relative to the circuit pattern formed through the immediately preceding pattern formation process (hereafter referred to as a "base pattern") is inspected, is executed by using marks indicating reference positions of the base pattern and the resist pattern.

The positions of the marks used in the alignment and the registration state inspection are detected by capturing images of the marks with an image capturing element such as a CCD camera and executing image processing on the image signals thus obtained.

However, distortion manifests in the image forming optical system that forms images of the marks on the image capturing surface of the image capturing element in the mark position detecting apparatus in the related art described above, which leads to a failure in detecting the mark positions with accuracy. At present, it is difficult to completely eliminate this distortion.

SUMMARY OF THE INVENTION

The present invention provides a mark position detecting apparatus capable of detecting mark positions with accuracy even when the image forming optical system which forms mark images is not completely free of distortion.

A mark position detecting apparatus according to the present invention comprises: an illuminating unit that illuminates a mark on a substrate; an image forming optical system that forms an image of the mark with light from the mark; an adjustment unit that adjusts distortion manifesting at the image forming optical system; an image capturing unit that captures the image of the mark formed by the image forming optical system in which the distortion has been adjusted and outputs image signals; and a calculation unit that calculates a substantial central position of the mark based upon the image signals output by the image capturing unit.

In this mark position detecting apparatus, it is preferred that the adjustment unit adjusts the distortion so that the distortion achieves substantial symmetry relative to a field center of the image forming optical system.

Also, it is preferred that the adjustment unit adjusts the distortion by tilting an optical axis of an optical element constituting at least part of the image forming optical system relative to an optical axis of the image forming optical system.

Also, it is preferred that a coma aberration correction unit that corrects a coma aberration manifesting at the image forming optical system in which the distortion has been adjusted, is further provided.

Another mark position detecting apparatus according to the present invention comprises: an illuminating unit that illuminates a mark on a substrate: an image forming optical system that forms an image of the mark with light from the mark; an optical element supporting unit that supports an optical element constituting part of the image forming optical system so as to allow the optical element to tilt around an axis extending perpendicular to an optical axis of the image forming optical system; an image capturing unit that captures the image of the mark formed by the image forming optical system and outputs image signals; and a calculation unit that calculates a position of the mark by using the image signals input from the image capturing unit.

In this mark position detecting apparatus, it is preferred that there are further provided: a measurement unit that measures a distribution state of distortion manifesting at the image forming optical system by using the image signals input from the image capturing unit; and a control unit that controls the optical element supporting unit based upon results of measurement by the measurement unit to adjust a tilt state of the optical element constituting the one part of the image forming optical system. In this case, it is preferred that: there is further provided a substrate supporting unit that supports the substrate so as to allow the substrate to rotate around the optical axis; and the measurement unit adjusts a rotational state of the substrate by controlling the substrate supporting unit and measures the distribution state of the distortion by using the image signals input from the image capturing unit before and after rotating the substrate by 180 degrees. Furthermore, it is preferred that the control unit adjusts the tilt state of the optical element constituting the one part of the image forming optical system so as to achieve symmetry for the distribution state of the distortion relative to a center of a field of the apparatus. Yet furthermore, it is preferred that: the optical element supporting unit supports an optical element constituting another part of the image forming optical system so as to allow the optical element to shift along an axis extending perpendicular to the optical axis; and the control unit corrects a coma aberration of the image forming optical system by causing the optical element constituting the other part to shift after adjusting the tilt state of the optical element constituting the one part of the image forming optical system.

BRIEF DESCRIPTION OF THE DRAWINGS

FIG. 2A is a plan view of a registration mark 30 formed at the wafer 11;

FIG. 2B is a sectional view of the registration mark 30 formed at the wafer 11;

FIG. 3A is as a plan view of a line & space mark 33 formed at the wafer 11;

FIG. 3B is a sectional view of the line & space mark 33 formed at the wafer 11

DESCRIPTION OF THE PREFERRED EMBODIMENTS

The following is a detailed explanation of an embodiment of the present invention, given in reference to the drawings.

Figure 1A:
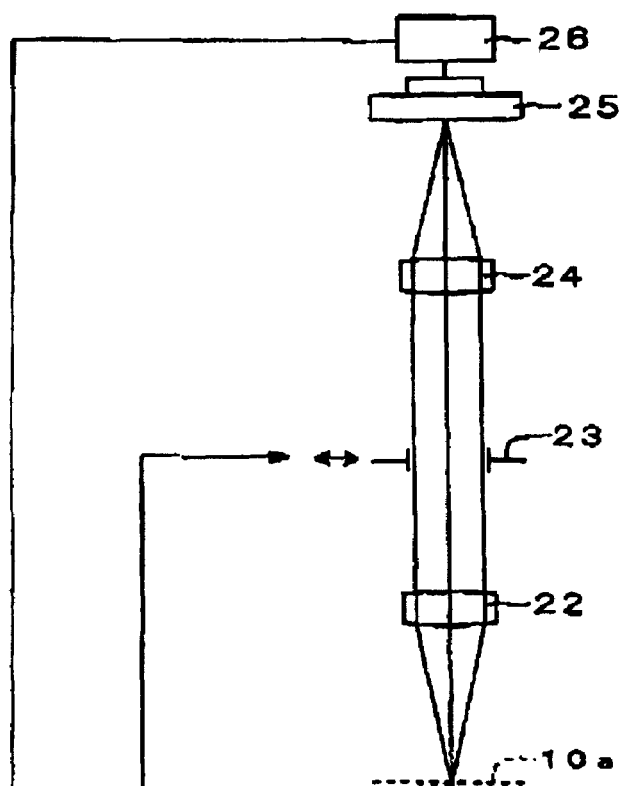
FIGS. 1A and 1B show the overall structure adopted in the registration measuring apparatus 100.
Figure 1B:
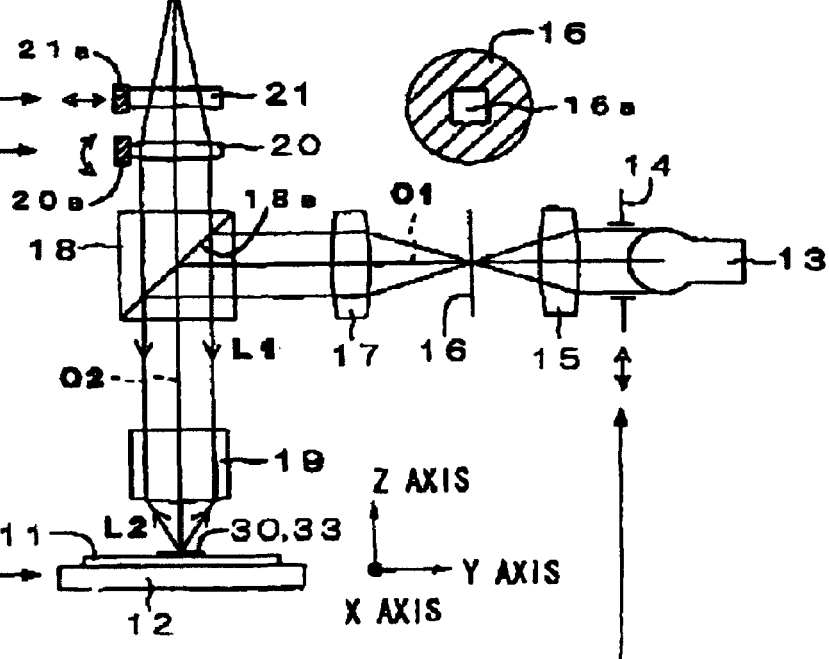

In reference to this embodiment, an example in which the mark position detecting apparatus according to the present invention is adopted in a registration measuring apparatus 100 shown in FIGS. 1A and 1B is explained. The registration measuring apparatus 100 is normally utilized to inspect a wafer having a resist pattern formed thereupon through a development step executed after transferring the pattern onto the resist with, for instance, a semiconductor exposure apparatus.

As shown in FIG. 1A, the registration measuring apparatus 100 comprises an inspection stage 12 which supports a wafer 11 (a substrate), i.e., a test object, an illuminating optical system (13~16) which emits illuminating light L1 toward the wafer 11 on the inspection stage 12, an image forming optical system (19~24) which forms an image of the wafer 11 illuminated with the illuminating light L1, a CCD image capturing element 25, an image processing device 26 and a control device 27.

Before describing the registration measuring apparatus 100 in more specific terms, the wafer 11, which is the test object, is first explained.

A plurality of circuit patterns (none shown) are laminated on the surface of the wafer 11. The circuit pattern at the uppermost layer is a resist pattern transferred onto a resist film. Namely, the wafer 11 is undergoing the process of forming another circuit pattern over the base pattern formed through the immediately preceding pattern formation process (, after the resist film is exposed and developed and before the film constituted of a specific material is etched).

The state of registration of the resist pattern relative to the base pattern at the wafer 11 is inspected by utilizing the registration measuring apparatus 100. Accordingly, a registration mark (see FIGS. 2A and 2B) to be used in the registration state inspection is formed at the wafer 11. FIG. 2A is a plan view of the registration mark 30 and FIG. 2B is its sectional view.

As shown in FIGS. 2A and 2B, the registration mark 30 is constituted of a base mark 31 and a resist mark 32 formed in rectangular shapes of different sizes. The base mark 31, which is formed concurrently while the base pattern is formed, indicates the reference position of the base pattern. The resist mark 32, which is formed concurrently with the formation of the resist pattern, indicates a reference position of the resist pattern. The base mark 31 and the resist mark 32 may each be referred to as a "test mark".

It is to be noted that although not shown, a film constituted of a specific material that is to be processed, is formed between the resist side where the resist mark 32 and the resist pattern are present and the base side where the base mark 31 and the base pattern are present. After the registration state is inspected by utilizing the registration measuring apparatus 100, this material film is actually processed via the resist pattern if the resist mark 32 is accurately registered relative to the base mark 31 and thus, the resist pattern is registered accurately relative to the base pattern.

It is to be noted that the registration mark 30 described above is also used when adjusting the distortion in the image forming optical system (19~24) constituting the registration measuring apparatus 100. While details are to be provided later, the adjustment of the distortion in the image forming optical system (19~24) is performed by using the registration mark 30 prior to the inspection of the registration state which is executed by utilizing the registration measuring apparatus 100.

In addition, a line & space mark 33 is formed at the wafer 11. As shown in FIGS. 3A and 3B, the line & space mark 33 has a 3 μm line width, a 6 μm pitch and an 85 nm step hight (approximately ⅛ of the measurement wave length λ). FIG. 3A is a plan view of the line & space mark 33, whereas FIG. 3B presents its sectional view.

This line & space mark 33 is used for fine-adjustments of the illuminating optical system (13~18) and the image forming optical system (19~24). While details are to be provided later, the fine-adjustments are performed by using the line & space mark 33 as necessary following the adjustment of the distortion in the image forming optical system (19~24) which is performed by using the registration mark 30 mentioned above and before the inspection of the registration state which is executed by employing the registration measuring apparatus 100.

Next, the structure of the registration measuring apparatus 100 (see FIGS. 1A and 1B) is explained in more specific terms.

The inspection stage 12 of the registration measuring apparatus 100 supports the wafer 11 while holding the wafer 11 level and also it allows the wafer 11 to move along the horizontal direction (the XY direction), the vertical direction (the Z direction) and the rotating direction (the e direction). The inspection stage 12 and the wafer 11 rotate around an optical axis O2 of the image forming optical system (19~24). The optical axis O2 extends parallel to the Z direction. The inspection stage 12 may be otherwise referred to as a "substrate supporting unit".

The illuminating optical system (13~18) comprises a light source 13, an illumination aperture stop 14, a condenser lens 15, a field aperture 16, an illumination relay lens 17 and a half-prism 18, which are disposed sequentially along an optical axis O1. The half-prism 18, whose reflection/transmission surface 18a is tilted at approximately 45 degrees relative to the optical axis O1, is set over the optical axis O2 of the image forming optical system (19~24) as well. The optical axis O1 of the illuminating optical system (13~18) extends perpendicular to the optical axis O2 of the image forming optical system (19~24).

In addition, the light source 13 in the illuminating optical system (13~18) emits white light. The illumination aperture stop 14 controls the diameter of the light beam emitted from the light source 13 so as to achieve a predetermined diameter. The illumination aperture stop 14 is supported so as to be allowed to shift relative to the optical axis O1. The adjustment of the shift state of the illumination aperture stop 14 is performed by using the line & space mark 33 (see FIGS. 3A and 3B) mentioned earlier and, as a result, a fine-adjustment of the illuminating optical system (13~18) is achieved.

The condenser lens 15 condenses the light from the illumination aperture stop 14. The field aperture 16, which is an optical element that limits the visual field of the registration measuring apparatus 100, includes a single slit 16a formed as a rectangular opening as shown in FIG. 1B. The illumination relay lens 17 collimates the light from the slit 16a of the field aperture 16. The half-prism 18 reflects the light from the illumination relay lens 17 and guides the light onto the optical axis O2 of the image forming optical system (19~24) (illuminating light L1).

The image forming optical system (19~24) comprises a first objective lens 19, second objective lenses 20 and 21, a first image forming relay lens 22, an image forming aperture stop 23 and a second image forming relay lens 24, which are disposed sequentially along the optical axis O2. Between the first objective lens 19 and the second objective lenses 20 and 21, the half-prism 18 mentioned earlier is provided.

The first objective lens 19 condenses the illuminating light L1 from the half-prism 18 onto the wafer 11 and also collimates the light (reflected light L2) generated at the wafer 11. Through the half-prism 18, the light from the first objective lens 19 is transmitted. Through the second objective lenses 20 and 21, an image is formed on a primary image forming surface 10a with the light from the half-prism 18.

In addition, a two-group configuration which includes a first group 20 and a second group 21 is adopted for the second objective lenses 20 and 21. A supporting member 20a supporting the first group 20 and a supporting member 21a supporting the second group 21 may each be referred to as an "optical element supporting unit".

The first group 20 of the second objective lenses, which is a lens system achieving a predetermined magnification factor, is supported so as to be allowed to tilt around the X axis and the Y axis perpendicular to the optical axis O2. The expression "allowed to tilt" in this context means that the optical axis of the first group 20 itself can be tilted relative to the optical axis O2 of the image forming optical system (19~24).

The second group 21 of the second objective lenses is an afocal system with no power, which is supported so as to be allowed to shift within the XY plane along an axis perpendicular to the optical axis O2. The expression "allowed to shift" in this context means that the optical axis of the second group 21 itself can be displaced in parallel translation without any tilt relative to the optical axis O2 of the image forming optical system (19~24).

The tilt of the first group 20 is adjusted by using the registration mark 30 (see FIGS. 2A and 2B) mentioned earlier and, as a result, the distortion in the image forming optical system (19~24) is adjusted. In addition, the shift state of the second group 21 is adjusted by using the line & space mark 33 (see FIGS. 3A and 3B) described earlier, and, as a result, the image forming optical system (19~24) is fine-adjusted. The first group 20 is an optical element constituting part of the image forming optical system and the second group 21 is an optical element constituting another part of the image forming optical system.

The first image forming relay lens 22 collimates the light from the second objective lenses 20 and 21. The image forming aperture stop 23 controls the diameter of the light beam from the first image forming relay lens 22 so as to achieve a predetermined diameter. This image forming aperture stop 23 is supported so as to be allowed to shift relative to the optical axis O2. The shift state of the image forming aperture stop 23 is adjusted by using the line & space mark 33 (see FIGS. 3A and 3B) mentioned earlier, and, as a result, the image forming optical system (19~24) is fine-adjusted. Through the second image forming relay lens 24, an image is reformed on the image capturing surface (secondary image forming surface) of the CCD image capturing element 25 with the light from the image forming aperture stop 23.

With the illuminating optical system (13~18) and the image forming optical system (19~24) structured as described above, the light emitted from the light source 13 evenly illuminates the field aperture 16 via the illumination aperture stop 14 and the condenser lens 15. Then, the light having passed through the slit 16a of the field aperture 16 is guided to the first objective lens 19 via the illumination relay lens 17 and the half-prism 16, and is transmitted through the first objective lens 19 to become the illuminating light L1 advancing substantially parallel to the optical axis O2. The illuminating light L1 illuminates the wafer 11 on the inspection stage 12 substantially perpendicular to the wafer 11.

The range of the incident angle of the illuminating light L1 entering the wafer 11 is determined by the aperture diameter of the illumination aperture stop 14 set on a plane which is conjugate with the pupil of the first objective lens 19. In addition, since the field aperture 16 and the wafer 11 are set at positions that are conjugate with each other, the area of the surface of the wafer 11 corresponding to the slit 16a of the field aperture 16 is evenly illuminated. In other words, an image of the slit 16a is projected onto the surface of the wafer 11.

Then, the reflected light L2 from the wafer 11 irradiated with the illuminating light L1 is guided to the second objective lenses 20 and 21 via the first objective lens 19 and the half-prism 18, and an image is formed with the reflected light on the primary image forming surface 10a through the second objective lenses 20 and 21. In addition, the light from the second objective lenses 20 and 21 is guided to the second image forming relay lens 24 via the first image forming relay lens 22 and the image forming aperture stop 23, and an image is reformed on the image capturing surface of the CCD image capturing element 25 through the second image forming relay lens 24. The CCD image capturing element 25 is an area sensor having a plurality of two-dimensionally arrayed pixels.

It is to be noted that the illuminating optical system (13~18) and the first objective lens 19 may be collectively referred to as an "illuminating unit". In addition, the CCD image capturing element 25 may be referred to as an "image capturing unit".

When the registration mark 30 (see FIGS. 2A and 2B) on the wafer 11 is positioned at the center of the field of the registration measuring apparatus 100, the registration mark 30 becomes illuminated with the illuminating light L1 and an image of the registration mark 30 is formed on the image capturing surface of the CCD image capturing element 25 as a result. At this point, the CCD image capturing element 25 captures the image of the registration mark 30 and outputs image signals corresponding to the intensity (brightness) of the light of the image to the image processing device 26.

In addition, as the line & space mark 33 (see FIGS. 3A and 3B) on the wafer 11 is positioned at the center of the field of the registration measuring apparatus 100, the line & space mark 33 becomes illuminated with the illuminating light L1 and, as a result, an image of the line & space mark 33 is formed on the image capturing surface of the CCD image capturing element 25. At this time, the CCD image capturing element 25 captures the image of the line & space mark 33 and outputs image signals corresponding to the intensity of the light of this image to the image processing device 26.

When the image signals of the image of the registration mark 30 (see FIGS. 2A and 2B) are input from the CCD image capturing element 25 to the image processing device 26, the image processing device 26 extracts a plurality of edges appearing in the image and calculates a central position C1 of the base mark 31 and a central position C2 of the resist mark 32 individually. An edge in this context refers to a point at which the image signal intensity manifests an acute change. The image processing device 26 may otherwise be referred to as a "calculation unit".

In addition, the image processing device 26 calculates the extent of registration offset R based upon the difference between the central position C1 of the base mark 31 and the central position C2 of the resist mark 32 when the state of the registration of the resist pattern relative to the base pattern at the wafer 11 is inspected. The extent of registration offset R is indicated as a two-dimensional vector at the surface of the wafer 11.

Also, prior to the calculation of the extent of registration offset R, the image processing device 26 measures the state of distribution of distortion in the image forming optical system (19~24) in the registration measuring apparatus 100 based upon the central position C1 of the base mark 31 and the central position C2 of the resist mark 32 (details are to be provided later). The image processing device 26 may also be referred to as a "measurement unit".

As the image signals of the image of the line & space mark 33 (see FIGS. 3A and 3B) are input from the CCD image capturing element 25 to the image processing device 26, the image processing device 26 measures the focus characteristics (see FIG. 7B) of a Q value which is to be detailed later, as an index to be used in the fine-adjustments of the illuminating optical system (13~18) and the image forming optical system (19~24).

Lastly, the structure of the control device 27 is explained. The control device 27 implements control by moving the inspection stage 12 and the wafer 11 along the XY direction so as to set the registration mark 30 (see FIGS. 2A and 2B) on the wafer 11 at the center of the field of the registration measuring apparatus 100 when the state of the registration of the resist pattern relative to the base pattern at the wafer 11 is inspected.

In addition, the control device 27 positions the registration mark 30 (see FIGS. 2A and 2B) at the field center as described above and implements rotational control for the inspection stage 12 and the wafer 11 along the θ direction to allow the image processing device 26 to measure the state of the distribution of the distortion in the image forming optical system (19~24) during the adjustment of the distortion in the image forming optical system (19~24) of the registration measuring apparatus 100. Based upon the state of the distortion distribution measured by the image processing device 26, it controls the supporting member 20a of the second objective lenses 20 and 21 to adjust the tilt of the first group 20.

Also, the control device 27 implements control on the inspection stage 12 and the wafer 11 by moving them along the XY direction to position the line & space mark 33 (see FIGS. 3A and 3B) on the wafer 11 at the center of the field of the registration measuring apparatus 100 during the fine-adjustments of the illuminating optical system (13~18) and the image forming optical system (19~24). It then engages the image processing device 26 in measurement of the Q value (see FIGS. 7A~7E) while implementing movement control on the inspection stage 12 and the wafer 11 alone the Z direction, and controls the supporting member 21a of the second objective lenses 20 and 21 as necessary to adjust the shift state of second group 21. The shift states of the illumination aperture stop 14 and the image forming aperture stop 23 are also adjusted as necessary.

Next, the adjustment of the distortion in the image forming optical system (19~24) and the fine-adjustments of the illuminating optical system (13~18) and the image forming optical system (19~24) in the registration measuring apparatus 100 assuming the structure described above are explained in sequence.

Under normal circumstances, distortion manifests at the image forming optical system (19~24). Due to this distortion, an image formed on the image capturing surface of the CCD image capturing element 25 becomes distorted. As indicated in expression (1) below, the extent of positional displacement Δ of the image attributable to the distortion increases in proportion to the cube of the image height y. y0 represents an arbitrary point of the image height y and D 0 indicates the distortion manifesting when y=y0.

$$\Delta=(D_0/y_0^2) \times y^3 \qquad (1)$$

In addition, the positional arrangement of the image forming optical system (19~24) normally contains a manufacturing error (decentering error) committed during the assembly process. Accordingly, the distortion in the image forming optical system (19~24) shows an asymmetrical distribution relative to the field center. As a result, the extent of positional displacement Δ of the image due to the distortion, too, shows an asymmetrical distribution relative to the field center as indicated by the curve b in FIG. 9A.

Figure 4A:
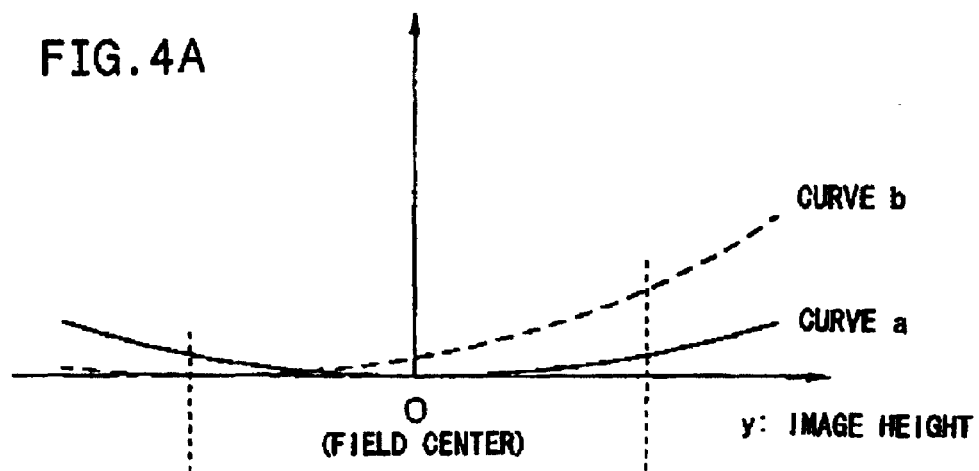
FIGS. 4A~4C schematically show the extent of image position misalignment attributable to the distortion in the image forming optical system (19~24)
Figure 4B:
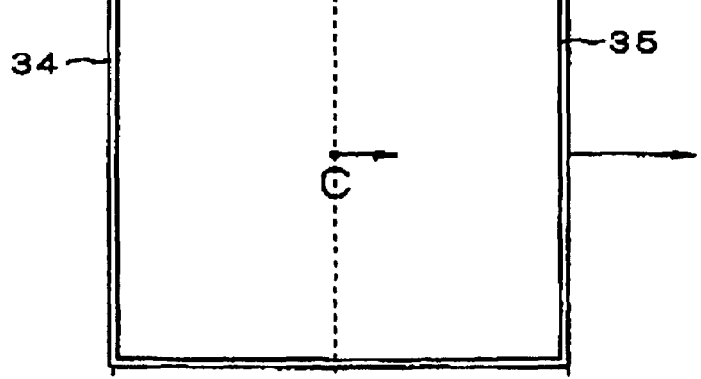

When, for instance, the registration mark 30 (see FIGS. 2A and 2B) is positioned at the field center while the extent of the positional displacement Δ of the image manifests an asymmetrical distribution relative to the field center as described above, a difference occurs in the extent of positional displacement at a left-side edge 34 and the extent of positional displacement at a right-side edge 35 of the image (indicated by the lengths of the arrows in the figure) of the rectangular mark (the base mark 31 or the resist mark 32), as shown in FIG. 4B.

Then, this difference in the extent of positional displacement becomes directly reflected in the results of the calculation of the central positions C of the rectangular marks (the central position C1 of the base mark 31 and the central position C2 of the resist mark 32 shown in FIGS. 2A and 2B), and thus, the extent of registration offset R described earlier cannot be calculated accurately.

If, on the other hand, the distortion in the image forming optical system (19~24) is distributed symmetrically relative to the field center, the extent of positional displacement Δ of the image attributable to the distortion, too, can be distributed symmetrically relative to the field center as indicated by the curve a in FIG. 4A.

Figure 4C:
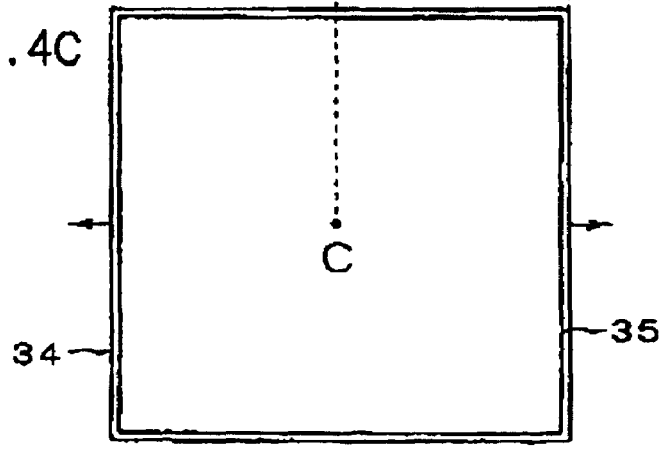

In this case, if, for instance, the registration mark 30 (see FIGS. 2A and 2B) is positioned at the field center, the extent of positional displacement at the left-side edge 34 and the extent of positional displacement at the right-side edge 35 of the image (indicated by the lengths of the arrows in the figure) of the rectangular mark (the base mark 31 or the resist mark 32) match, as shown in FIG. 4C.

Consequently, when calculating the central positions C of the rectangular marks (the central position C1 of the base mark 31 and the central positions C2 of the resist mark 32 shown in FIGS. 2A and 2B), the extent of positional displacement at the left-side edge 34 and the extent of positional displacement at the right-side edge 35 cancel each other out and, as a result, the extent of registration offset R can be accurately determined.

In the embodiment, the first group 20 of the second objective lenses 20 and 21 is allowed to tilt around the X axis and the Y axis so as to achieve a symmetrical distribution of the distortion relative to the field center by adjusting the distortion in the image forming optical system (19~24) and to ultimately achieve a symmetrical distribution relative to the field center for the extent of positional displacement Δ of the image attributable to the distortion (curve b->curve a in FIG. 4A), since the state of the distribution of the distortion manifesting at the image forming optical system (19~24) can be changed through an adjustment of the tilt of the first group 20.

In addition, a TIS (tool-induced shift) value which is to be detailed later is used as an index for deciding whether the distribution at the image forming optical system (19~24) shows an asymmetrical distribution or a symmetrical distribution relative to the field center. The TIS value is 0 when the distortion in the image forming optical system (19~24) is distributed symmetrically relative to the field center, whereas it assumes an arbitrary value (not-zero) if the distortion is distributed asymmetrically. Furthermore, as the extent of asymmetry of the distortion distribution increases, the TIS value becomes higher as well.

Now, the method adopted to measure the TIS value is briefly explained. For the TIS value measurement, the registration mark 30 (see FIGS. 2A and 2B) on the wafer 11 is positioned at the center of the field of the registration measuring apparatus 100. The control device 27 engages the image processing device 26 in operation to individually calculate the central position C1 of the base mark 31 and the central position C2 of the resist mark 32 before and after the wafer 11 is rotated by 180 degrees around the optical axis O2 (see FIGS. 5A and 5B).

Figure 5A:
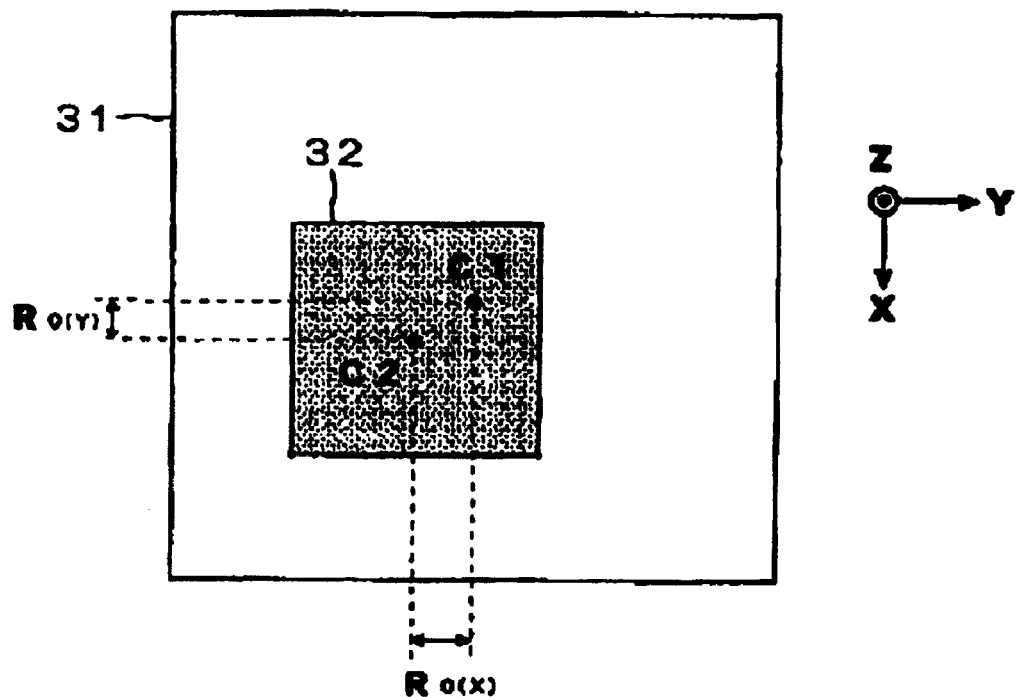
FIGS. 5A and 5B illustrate the method of TIS value measurement.
Figure 5B:
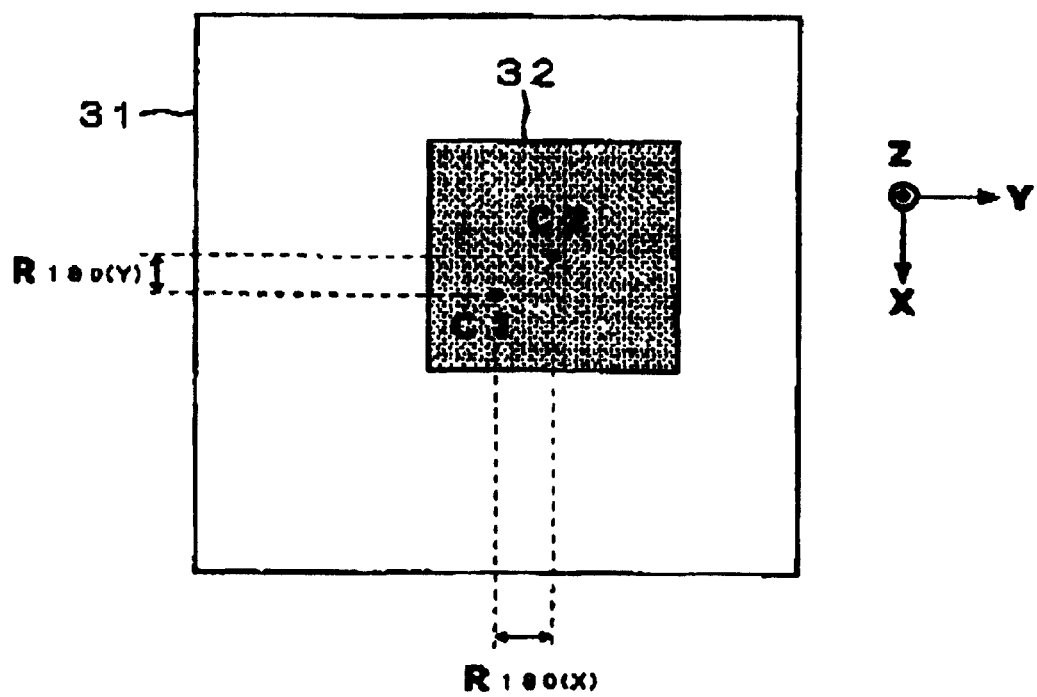

The image processing device 26 calculates the extent of registration offset $R_0$ along the 0 degree direction relative to an origin point set at the central position C1 based upon the central positions C1 and C2 calculated in the state shown in FIG. 5A and likewise, calculates the extent of registration offset $R_{180}$ along the 180 degrees direction relative to the origin point set at the central position C1 based upon the central positions C1 and C2 calculated in the state shown in FIG. 5B. Then, it measures the TIS value by using expression (2) presented below.

$$TIS\ value = (R_0 + R_{180})/2 \tag{2}$$

The state of the distribution of the distortion in the image forming optical system (19~24) is judged by using the TIS value as an index and, based upon the results of the judgment, the tilt of the first group 20 of the second objective lenses 20 and 21 is adjusted. The procedure followed to ultimately achieve a symmetrical distribution state relative to the field center for the distortion in the image forming optical system (19~24) is as schematically indicated in steps S1~S3 in FIG. 6.

It is to be noted that through the processing executed in steps S1~S3 in FIG. 6, the distortion in the image forming optical system (19~24) is adjusted, whereas in the next step S4, processing for fine-adjusting the illuminating optical system (13~18) and the image forming optical system (19~24) is executed as detailed later.

In step S1 in FIG. 6, the control device 27 takes in the TIS value measured by the image processing device 26, and in the following step S2, it compares the TIS value with a predetermined threshold value. A value which is sufficiently small is selected for the threshold value.

Then, if the measured TIS value is larger than the threshold value (S2, N), the distortion in the image forming optical system (19~24) is distributed asymmetrically relative to the field center and, accordingly, the tilt of the first group 20 of the second objective lenses 20 and 21 is adjusted in the following step S3 to slightly change the distribution state of the distortion in the image forming optical system (19~24). Then, after the tilt adjustment for the first group 20 is completed, the processing in steps S1 and S2 is executed again.

The control device 27 repeatedly executes the processing in steps S1~S3 as described above until the measured TIS value has become smaller than the threshold value. Once the measured TIS value becomes smaller than the threshold value (S2, Y), the distribution of the distortion in the image forming optical system (19~24), too, has become symmetrical relative to the center of the field and, accordingly, the operation proceeds to the next step S4.

It is to be noted that the extent of positional displacement Δ of the image attributable to the distortion in the image forming optical system (19~24), too, becomes distributed symmetrically relative to the field center at this point (the curve a in FIG. 4A). Thus, when calculating the central positions C of the rectangular marks (the central positions C1 and C2 shown in FIGS. 2A and 2B) positioned at the center of the field as shown in FIG. 4C, the extents of positional displacement A at the left-side edge 34 and the right-side edge 35 cancel out each other and, as a result, it becomes possible to accurately determine the extent of registration offset R.

However, when the tilt of the first group 20 of the second objective lenses 20 and 21 is adjusted, a slight eccentric coma aberration may occur at the image forming optical system (19~24). In the embodiment, the second group 21 of the second objective lenses is allowed to shift so as to enable a correction of such an eccentric coma aberration and ultimately to determine the extent of registration offset R mentioned earlier with a higher degree of accuracy.

In addition, in order to calculate the extent of registration offset R with greater accuracy, the eclipse of the reflected light L2 and the inclination of the primary ray of the illuminating light L1 (illumination telecentricity) are corrected as well as correcting the eccentric coma aberration at the image forming optical system (19~24) in the embodiment. The corrections of the eclipse of the reflected light L2 and the inclination of the illuminating light L1 are both achieved through shift adjustments of the image forming aperture stop 23 and the illumination aperture stop 14.

It is to be noted that the shifts of the second group 21 of the second objective lenses, the image forming aperture stop 23 and the illumination aperture stop 14 may be adjusted by adopting the method disclosed in Japanese Laid open Patent Publication No. 2000-77295 (referred to as the "QZ method").

Figure 6:
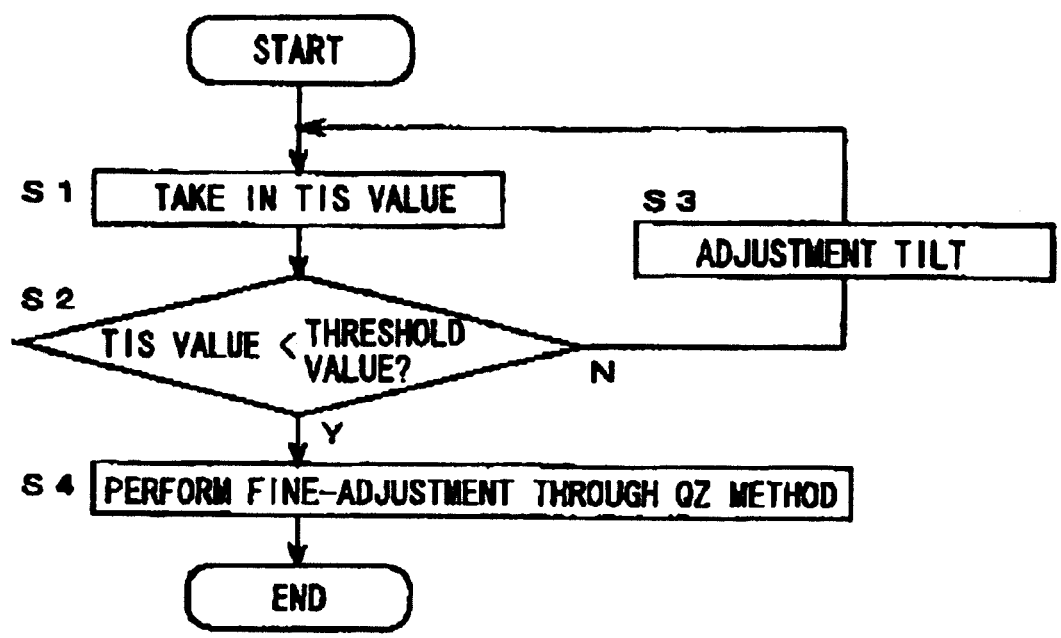
FIG. 6 presents a flow chart of the optical system adjustment procedure executed prior to the inspection of the registration state in the registration measuring apparatus 100.

As described above, shift adjustments are executed for the second group 21 of the second objective lenses, the image forming aperture stop 23 and the illumination aperture stop 14 by adopting the QZ method in step S4 in FIG. 6 in order to determine the extent of registration offset R with further accuracy in the embodiment.

Figure 7A:
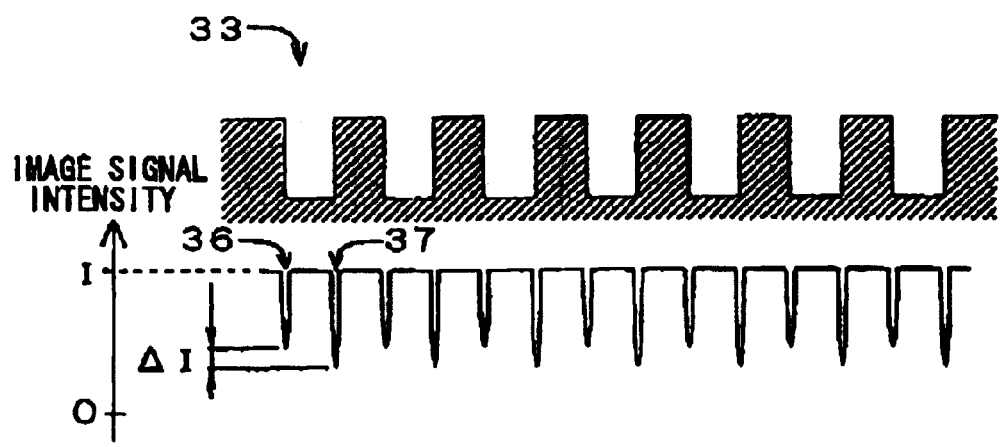
FIGS. 7A~7E illustrate the optical system fine-adjustment method achieved by adopting the QZ method.

During this process, the line & space mark 33 (see FIGS. 3A and 3B) on the wafer 11 is positioned at the center of the field of the registration measuring apparatus 100 and, as a result, image signals corresponding to the intensity of the light of the image of the line & space mark 33 are input to the image processing device 26, as shown in FIG. 7A.

As the image signals (see FIG. 7A) of the image of the line & space mark 33 are input, the image processing device 26 extracts a plurality of edges appearing in the image and calculates a signal intensity difference $\Delta I$ between a left-side edge 36 and a right-side edge 37. In additions a Q value is calculated through expression (3) presented below by normalizing the signal intensity difference $\Delta I$ thus obtained with an arbitrary signal intensity I. The Q value indicates the extent of asymmetry between the left-side edge 36 and the right-side edge 37.

$$Q \text{ value} \times \Delta I / I \times 100 (\%) \quad (3)$$

Figure 7B:
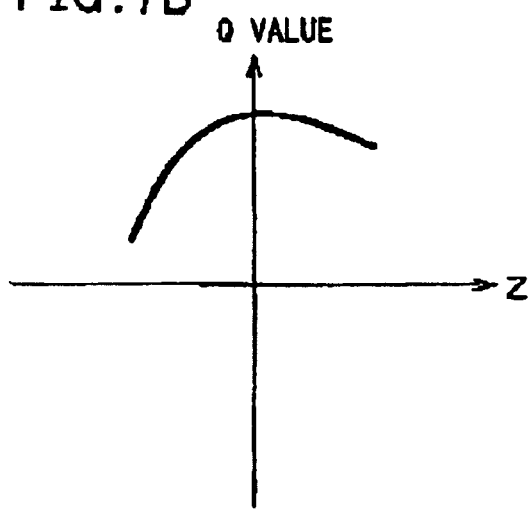

This calculation of the Q value is executed each time the control device 27 moves the wafer 11 along the Z direction. As a result, a focus characteristics curve of the Q value such as that shown in FIG. 7B is obtained.

The control device 27 executes the shift adjustments for the second group 21 of the second objective lenses, the image forming aperture stop 23 and the illumination aperture stop 14 by using the Q value focus characteristics curve (see FIG. 7B) as an index (the QZ method).

Figure 7C:
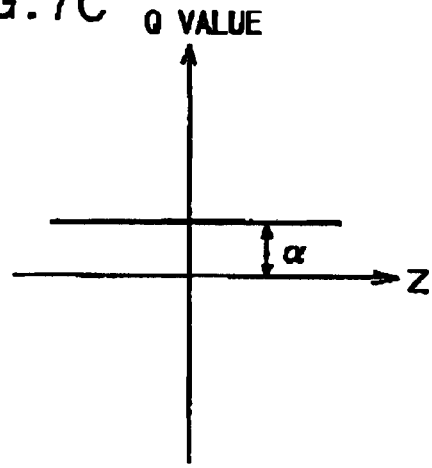
Figure 7D:
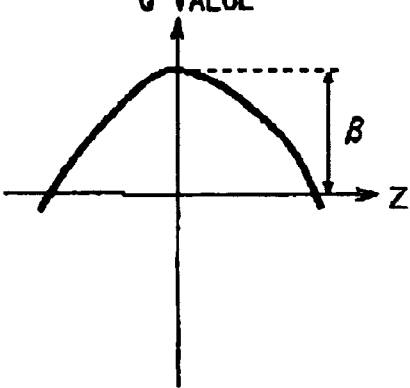
Figure 7E:
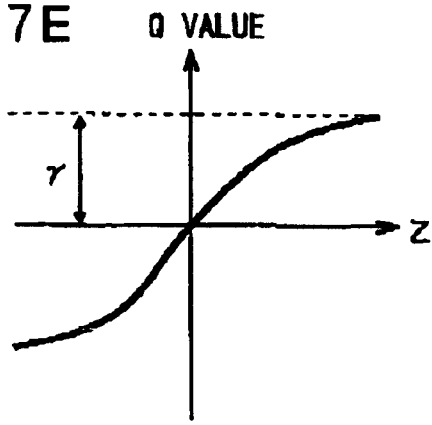

A parallel shift component $\alpha$ shown in FIG. 7C contained in the Q value focus characteristics curve (see FIG. 7B) is a component that fluctuates in response to the shift adjustment of the illumination aperture stop 14. In addition, an indentation/projection (unevenness) component $\beta$ shown in FIG. 7D fluctuates in response to the shift adjustment of the image forming aperture stop 23. An inclination component $\gamma$ shown in FIG. 7E fluctuates in response to the shift adjustment of the second group 21 of the second objective lenses.

Thus, by adjusting the shifts of the second group 21 of the second objective lenses, the image forming aperture stop 23 and the illumination aperture stop 14 as necessary, the Q value focus characteristics curve (see FIG. 7B) can be made to converge to predetermined standard value (e.g., equivalent to a state in which 0 is indicated regardless of the Z position).

Once the fine-adjustment processing for the illuminating optical system (13~16) and the image forming optical system (19~24) executed through the QZ method is completed, the control device 27 positions the registration mark 30 (see FIGS. 2A and 2B) on the wafer 11 again at the center of the field of the registration measuring apparatus 100 in order to inspect the state of the registration of the resist pattern relative to the base pattern at the wafer 11. Then, the image processing device 26 calculates the extent of registration offset R based upon the difference between the central position C1 of the base mark 31 and the central position C2 of the resist mark 32.

By adopting the embodiment, in which a symmetrical distribution of the extent of positional displacement $\Delta$ of the image attributable to the distortion in the image forming optical system (19~24) is achieved relative to the field center (the curve a in FIG. 4A), the central position C1 of the base mark 31 and the central position C2 of the resist mark 32 can be calculated accurately. As a result, the extent of registration offset R, too, can be calculated with a high degree of accuracy.

In addition, since the eccentric coma aberration and the eclipse of the reflected light L2 and the inclination of the principal ray of the illuminating light L1 (illumination telecentricity) at the image forming optical system (19~24) are also corrected, the calculation of the central positions C1 and C2 and the extent of registration offset R can be executed with further accuracy in the embodiment.

Thus, by utilizing the registration measuring apparatus 100, the state of registration at the wafer 11 can be inspected with a high degree of accuracy even when there is distortion manifesting at the image forming optical system (19~24) and a further improvement in the product yield can be achieved.

It is to be noted that while the tilt of the first group 20 of the second objective lenses is adjusted in order to adjust the distribution of the distortion in the image forming optical system (19~24) in the embodiment described above, the present invention is not limited to this structural example. For instance, a tilt adjustment may instead be executed for the second group 21 of the second objective lenses. Alternatively, a tilt adjustment may be executed for the first objective lens 19, the first image forming relay lens 22 or the second image forming relay lens 24, instead.

Furthermore, while a shift adjustment of the second group 21 of the second objective lenses is executed in order to correct the eccentric coma aberration at the image forming optical system (19~24) in the embodiment explained above, the present invention is not limited to this structural example. For instance, a shift adjustment of the first group 20 of the second objective lenses may instead be performed. Alternatively, a shift adjustment may be executed for the first objective lens 19, the first image forming relay lens 22 or the second image forming relay lens 24.

However, it is more desirable to adjust the shift of an afocal system such as the second group 21 of the second objective lenses, since a shift adjustment of a lens achieving a specific magnification factor such as the first group 20 of the second objective lenses may induce a new aberration (such as chromatic aberration) other than the eccentric coma aberration.

In addition, it is more desirable to provide different lenses for the tilt adjustment and the shift adjustment, since the drive system required to execute a tilt adjustment and a shift adjustment on a common lens is bound to be complex and large.

Furthermore, while the adjustments of the illuminating optical system (13~18) and the image forming optical system (19~24) are automatically executed by the control device 27 and then the central positions C1 and C2 of the base mark 31 and the resist mark 32 in the registration mark 30 and the extent of registration offset R are detected in the embodiment described above, the present invention may also be adopted in an apparatus in which adjustments and positional detections are performed manually. In the latter case, the registration measuring apparatus 100 does not need to include the control device 27.

In addition, while an explanation is given above in reference to the embodiment on an example in which the present invention is adopted in the registration measuring apparatus 100, the present invention is not limited to this example.

Figure 8:
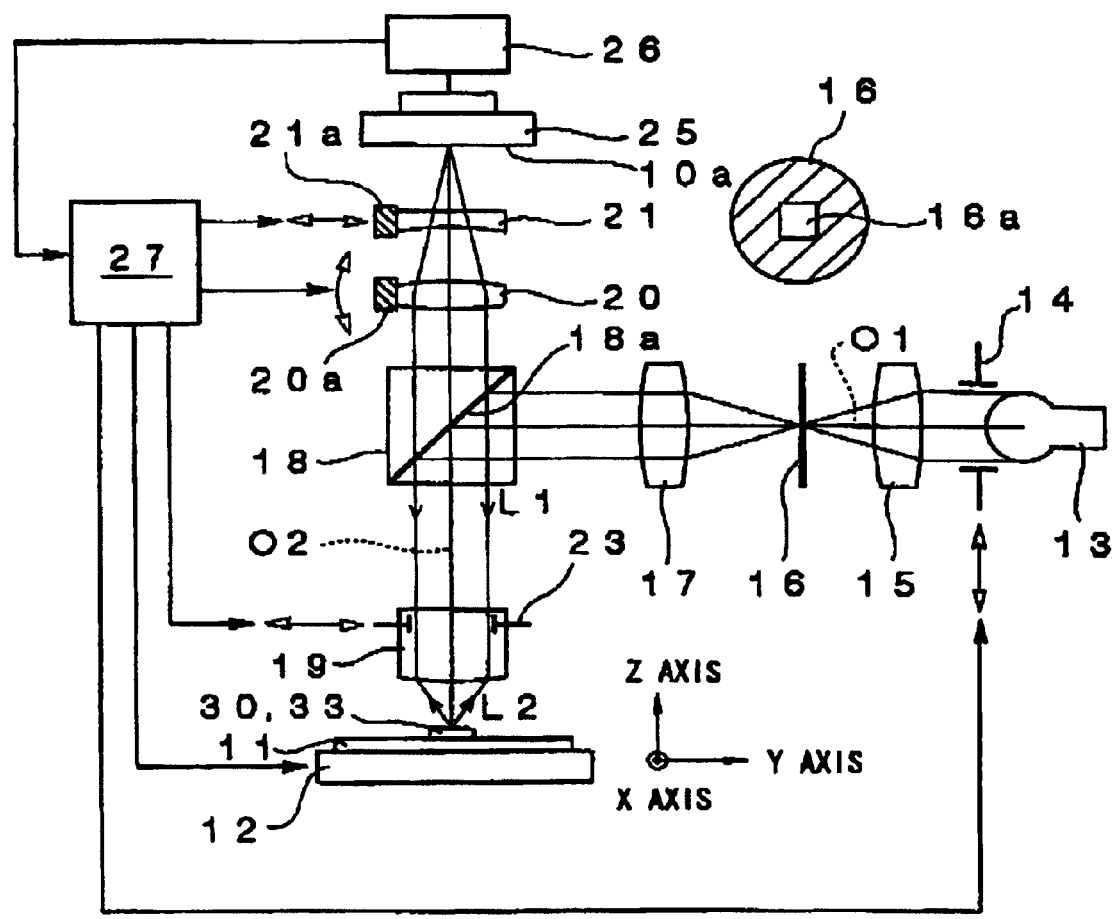
FIG. 8 shows the overall structure adopted in the registration measuring apparatus 101.

A registration measuring apparatus 101 shown in FIG. 8 adopts a structure achieved by dispensing with the first image forming relay lens 22, the image forming aperture stop 23 and the second image forming relay lens 24 constituting the relay optical system in the registration measuring apparatus 100, providing the CCD image capturing element 25 on the primary image forming surface 10a and providing the image forming aperture stop 23 in the first objective lens 19. This structure, too, enables optical system adjustments identical to those achieved in the registration measuring apparatus 100.

The present invention may also be adopted in an apparatus that aligns a mask and the wafer 11 (the alignment system of an exposure apparatus) prior to the exposure step in which the circuit pattern formed at the mask imprinted on the resist film. In this case, the position of an alignment mark formed on the wafer 11 can be accurately detected. Moreover, the present invention may be adopted in an apparatus that detects an optical positional displacement manifesting between a single mark and a reference position of a camera as well.

Moreover, while an explanation is given above in reference to the embodiments on an example in which the present invention is adopted in the mark position detection executed during the process of semiconductor production, the present invention is not limited by these details either. The mark position detecting apparatus according to the present invention may be utilized in any situation that requires a highly accurate mark position detection.

The above described embodiments are examples, and various modifications can be made without departing from the spirit and scope of the invention.

What is claimed is:

1. A mark position detecting apparatus comprising:
    an illuminating unit that illuminates a plurality of marks on a substrate using a single illuminating optical system;
    an image forming optical system that forms images of the plurality of marks with light from the marks;
    an image capturing unit that captures the images of the plurality of marks and outputs image signals;
    a measurement unit that measures a distribution state of distortion manifesting at the image forming optical system by using the image signals input from the image capturing unit;
    an adjustment unit that adjusts the distortion manifesting at the image forming optical system based upon the distribution state of the distortion; and
    a calculation unit that calculates relative positions between the plurality of marks by using the image signals input from the image capturing unit.

2. A mark position detecting apparatus according to claim 1, wherein:
    the adjustment unit comprises an optical element tilt supporting unit that supports an optical element constituting at least part of the image forming optical system so as to allow an optical axis of the optical element to tilt relative to an optical axis of the image forming optical system.

3. A mark position detecting apparatus according to claim 1, further comprising:
    a control unit that controls the adjustment unit based upon results of measurement by the measurement unit to adjust the distribution state of the distortion.

4. A mark position detecting apparatus according to claim 1, further comprising:
    a substrate supporting unit that supports the substrate so as to allow the substrate to rotate around an optical axis of the image forming optical system, wherein:
    the measurement unit adjusts a rotational state of the substrate by controlling the substrate supporting unit and measures the distribution state of the distortion by using the image signals input from the image capturing unit before and after rotating the substrate by 180 degrees.

5. A mark position detecting apparatus according to claim 1, wherein:
    the adjustment unit adjusts the distortion so that the distortion achieves substantial symmetry relative to a field center of the image forming optical system.

6. A mark position detecting apparatus according to claim 2, further comprising:
    a coma aberration correction unit that corrects a coma aberration manifesting at the image forming optical system.

7. A mark position detecting apparatus according to claim 6, wherein:
    the coma aberration correction unit comprises an optical element shift supporting unit that supports an optical element constituting another part of the image forming optical system so as to allow the optical element constituting the another part to shift in a plane substantially perpendicular to the optical axis of the image forming optical system.

8. A mark position detecting apparatus according to claim 7, further comprising:
    a control unit that controls the adjustment unit and the coma aberration correction unit so as to correct the coma aberration of the image forming optical system by causing the optical element constituting the another part to shift after adjusting a tilt state of the optical element constituting the one part of the image forming optical system.

9. A mark position detecting apparatus according to claim 1, wherein:
    the adjustment unit adjusts the distortion so that the distortion achieves substantial symmetry relative to an optical axis of the image forming optical system.

10. A mark position detecting apparatus according to claim 9, further comprising:
    a substrate supporting unit that supports the substrate so as to position central positions of the marks formed on the substrate in a vicinity of the optical axis of the image forming optical system.

11. A mark position detecting apparatus comprising:

an illuminating unit that illuminates a mark on a substrate;

an image forming optical system that forms an image of the mark with light from the mark;

an image capturing unit that captures the image of the mark and outputs image signals;

a substrate supporting unit that supports the substrate so as to allow the substrate to rotate around an optical axis of the image forming optical system;

a measurement unit that adjusts a rotational state of the substrate by controlling the substrate supporting unit and measures positions of the mark before and after rotating the substrate by 180 degrees by using the image signals input from the image capturing unit before and after rotation of the substrate;

an adjustment unit that adjusts distortion manifesting at the image forming optical system based upon the positions of the mark measured with the measurement unit; and a calculation unit that calculates a position of the mark based upon the image signals input from the image capturing unit.

12. A mark position detecting apparatus according to claim 11, wherein:

the adjustment unit comprises an optical element tilt supporting unit that supports an optical element constituting at least part of the image forming optical system so as to allow an optical axis of the optical element to tilt relative to an optical axis of the image forming optical system.

13. A mark position detecting apparatus according to claim 11, further comprising:

a control unit that controls the adjustment unit based upon results of measurement by the measurement unit to adjust a distribution state of the distortion.

14. A mark position detecting apparatus according to claim 11, wherein:

the adjustment unit adjusts the distortion so that the distortion achieves substantial symmetry relative to a field center of the image forming optical system.

15. A mark position detecting apparatus according to claim 12, further comprising:

a coma aberration correction unit that corrects a coma aberration manifesting at the image forming optical system.

16. A mark position detecting apparatus according to claim 15, wherein:

the coma aberration correction unit comprises an optical element shift supporting unit that supports an optical element constituting another part of the image forming optical system so as to allow the optical element constituting the another part to shift in a plane substantially perpendicular to the optical axis of the image forming optical system.

17. A mark position detecting apparatus according to claim 15, further comprising:

a control unit that controls the adjustment unit and the coma aberration correction unit so as to correct the coma aberration of the image forming optical system by causing an optical element constituting another part of the image forming optical system to shift after adjusting a tilt state of the optical element constituting the at least part of the image forming optical system.

18. A mark position detecting apparatus according to claim 11, wherein:

the adjustment unit adjusts the distortion so that the distortion achieves substantial symmetry relative to an optical axis of the image forming optical system.

19. A mark position detecting apparatus according to claim 18, wherein:

the substrate supporting unit positions a central position of the mark formed on the substrate in the vicinity of the optical axis of the image forming optical system.

* * * * *